United States Patent
Power et al.

(10) Patent No.: US 7,723,777 B2
(45) Date of Patent: May 25, 2010

(54) SEMICONDUCTOR DEVICE AND METHOD FOR MAKING SAME

(75) Inventors: John Power, Dresden (DE); Mayk Roehrich, Dresden (DE); Martin Stiftinger, Stockdorf (DE); Robert Strenz, Radebeul (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/189,830

(22) Filed: Aug. 12, 2008

(65) Prior Publication Data

US 2010/0038696 A1    Feb. 18, 2010

(51) Int. Cl.
*H01L 29/94* (2006.01)

(52) U.S. Cl. ............ 257/316; 257/296; 257/298; 257/314; 257/321; 257/336; 257/E21.625

(58) Field of Classification Search ............ None
See application file for complete search history.

(56) References Cited

U.S. PATENT DOCUMENTS

| | | | | |
|---|---|---|---|---|
| 5,759,885 A | * | 6/1998 | Son ............... | 438/230 |
| 5,770,493 A | * | 6/1998 | Fulford, Jr. .......... | 438/199 |
| 6,670,227 B1 | * | 12/2003 | Thio et al. .......... | 438/201 |
| 6,743,675 B2 | * | 6/2004 | Ding ............... | 438/257 |

\* cited by examiner

*Primary Examiner*—N Drew Richards
*Assistant Examiner*—Kyoung Lee
(74) *Attorney, Agent, or Firm*—Philip H. Schlazer; Patent Department

(57) ABSTRACT

One or more embodiments, relate to a field effect transistor, comprising: a substrate; a gate stack disposed over the substrate, the gate stack comprising a gate electrode overlying a gate dielectric; and a sidewall spacer may be disposed over the substrate and laterally disposed from the gate stack, the spacer comprising a polysilicon material.

15 Claims, 8 Drawing Sheets

SEMICONDUCTOR DEVICE AND METHOD FOR MAKING SAME

FIELD OF THE INVENTION

One or more embodiments of the present invention relate to semiconductor devices and methods of making semiconductor devices.

BACKGROUND OF THE INVENTION

In order to direct high-voltages from the on-chip charge pumps to the appropriate Flash cell in an embedded Flash technology, special transistors over and above the standard logic CMOS transistors may be required which are robust in the face of such high voltages. These transistors may suffer from gate-induced drain leakage (GIDL) constraints in the off-state which may be avoided through offsetting the source/drain implants from the gate stack edge. Such offsetting may be accomplished through lithographic means and the accuracy of the offset may thus depend on the overlay of the lithographic process. A new way to provide offsetting is needed.

SUMMARY OF THE INVENTION

One or more embodiments relate to a field effect transistor, comprising: a substrate; a gate stack disposed over the substrate, the gate stack comprising a gate electrode overlying a gate dielectric; and a sidewall spacer disposed over the substrate and laterally disposed from the gate stack, the spacer comprising a polysilicon material.

One or more embodiments an integrated circuit, comprising: a substrate; a memory device including: a first gate stack disposed over the substrate, the first gate stack comprising a control gate disposed over a charge storage layer, and a polysilcon spacer select gate overlying the substrate, the spacer select gate laterally disposed from the first gate stack; and a field effect transistor including: a second gate stack disposed over the substrate, the second gate stack comprising a gate electrode overlying a gate dielectric, and a polysilicon spacer disposed over the substrate and laterally disposed from the transistor gate stack.

One or more embodiments relate to a method of forming an integrated circuit, comprising: providing a substrate; forming a first gate stack for a memory device over a first portion of the substrate; forming a second gate stack for a field effect transistor over a second portion of the substrate; forming a polysilicon layer over the first gate stack and over the second gate stack; and etching the polysilicon layer to form polysilicon sidewall spacers over the sidewalls of the first gate stack and the second gate stack.

DETAILED DESCRIPTION OF THE INVENTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

FIGS. 1 through 14 illustrate cross-sectional views of structures of a semiconductor chip or integrated circuit at various stages of fabrication in accordance with one or more embodiments of the invention. The chip or integrated circuit may include at least a first portion 1000A, a second portion 1000B and a third portion 1000C. In the embodiment illustrated in FIGS. 1 through 14, the first portion 1000A of the chip or integrated circuit may be a memory portion of the semiconductor device or chip. The memory portion 1000A may include, for example, a charge storage memory device such as a floating gate memory device or a charge trapping memory device. In the embodiment illustrated in FIGS. 1 through 14, the second portion 1000B of the chip or integrated circuit may be a first logic portion of the chip or integrated circuit. The first logic portion 1000B may include a first transistor device. The first transistor device may be a field effect transistor. The field effect transistor may be a MOS transistor. The MOS transistor may be PMOS transistor or an NMOS transistor. The first logic portion may, for example, be a high-voltage logic portion. The transistor may be a high-voltage transistor. The first logic portion may, for example, be used for the peripheral circuitry of a memory array formed in the memory portion.

The third portion 1000C of the semiconductor chip or integrated circuit may be a second logic portion of the chip or integrated circuit. The second logic portion may include a second transistor device. The second transistor may be a field effect transistor. The field effect transistor may be a MOS transistor. The MOS transistor may be an NMOS transistor or a PMOS transistor. The second logic portion may, for example, be a low-voltage logic portion. The second transistor may be a low-voltage transistor. The second logic portion may, for example, be used to form logic gates such as AND, NAND, NOR and OR gates.

Hence, in one or more embodiments, the three portions 1000A, 1000B and 1000C may be formed as part of a semiconductor chip or integrated circuit. In one or more embodiments, the three portions 1000A, 1000B and 1000C may be formed on a common semiconductor substrate. In one or more embodiments, the memory portion 1000A may be in electrical communication with the first logic portion 1000B. In one or more embodiments, the memory portion 1000A may be in electrical communication with the second logic portion 1000C. In one or more embodiments, the first logic portion 1000B may be in electrical communication with the second logic portion 1000C.

FIGS. 1 through 14 illustrate cross-sectional views showing the formation of a memory device (structures 1010A through 1140A), a first transistor (structures 1010B through 1140B), and a second transistor (structures 1010C through 1140C).

Figure 1:
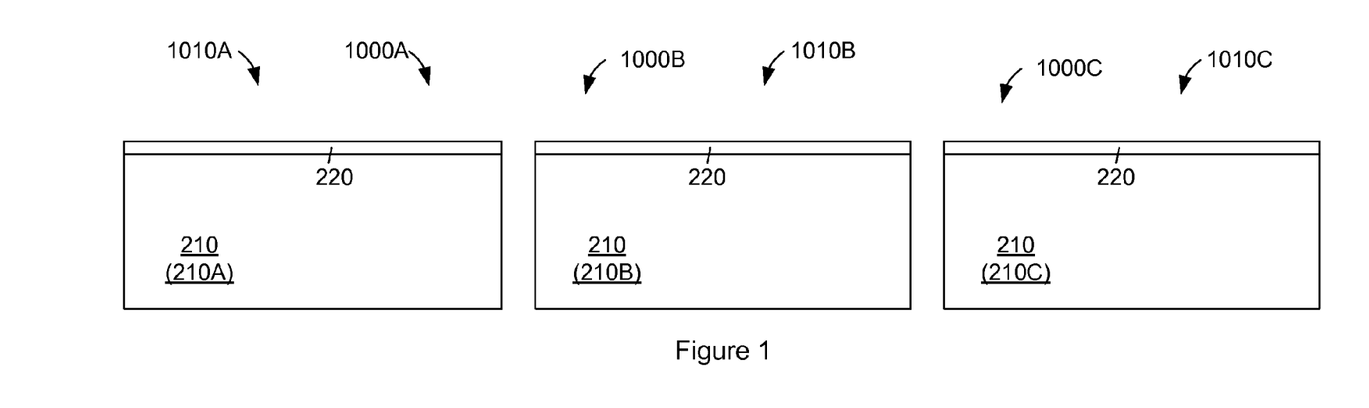
FIGS. 1 through 14 provide an embodiment of a method of making an embodiment of a memory device, an embodiment of a first transistor and an embodiment of a second transistor accordance with the present invention.

Referring to FIG. 1, a common semiconductor substrate 210 is provided for the first portion 1000A, second portion 1000B and third portion 1000C. The substrate 210 may be a silicon substrate or other suitable substrate. The substrate 210 may be a silicon-on-insulator (SOI) substrate. The SOI substrate may, for example, be formed by a SIMOX process. The substrate may be a silicon-on-sapphire (SOS) substrate. The substrate 210 may, for example, be a p-doped substrate which may be useful for an n-channel device. The substrate 210 may, for example, be a p-doped substrate that also includes an n-doped well formed in an upper portion of the substrate 210. The n-doped well may be useful for a p-channel device.

Hence, the substrate 210 includes three portions 210A, 210B and 210C. While not shown in FIG. 1, isolation regions may be defined in the substrate 210. For example, isolation regions may be formed in the substrate which isolate one memory or transistor device from another. For example, isolation regions may be formed which isolate one memory device from another. Isolation regions may be formed as trenches that are filled with an insulating material, such as $SiO_2$ or other suitable insulating material, to insulate one transistor cell from adjacent transistor cells. In one or more embodiments, isolation regions may be formed using a shallow trench isolation (STI) process. In one or more embodiments, isolation regions may be formed otherwise, such as by a LOCOS process. In one or more embodiments, isolation regions may be formed using deep trench processes.

Still referring to FIG. 1, a first dielectric layer 220 is formed over the substrate 210. In the embodiment shown, a first dielectric layer 220 is formed over first substrate portion 210A to form a structure 1010A, over second substrate portion 210B to form a structure 1010B and over third substrate portion 210C to form a structure 1010C. The first dielectric layer 220 may include an oxide. An example of an oxide is silicon dioxide ($SiO_2$). In an embodiment of the invention, the first dielectric layer 220 may be an oxide (such as silicon dioxide) that is formed by a growth process. Another example of an oxide is tantalum oxide. In an embodiment, the first dielectric layer 220 may include a nitride. An example of a nitride is silicon nitride. In an embodiment, the first dielectric layer 220 may include a nitrided oxide. In an embodiment, the first dielectric material may include an oxynitride. An example of an oxynitride is SiON. Another example of an oxynitride is $SiO_xN_y$. In an embodiment, the first dielectric layer 220 may include a high-k dielectric. As one example, the high-k dielectric may have a dielectric constant greater than that of silicon dioxide. In another example, the high-k dielectric may have a dielectric constant greater than about 3.9.

In an embodiment, the first dielectric layer may comprise two or more materials. For example, the first dielectric layer may be a mixture of two or more material. In one or more embodiments, the mixture may be a homogeneous mixture. In one or more embodiments, the mixture may be a heterogeneous mixture. The first dielectric layer 220 may be formed of a composite of two or more materials. In one or more embodiments, the first dielectric layer 220 may be formed as a stack of two or more sub-layers. In one or more embodiments, the first dielectric layer 220 may have a thickness greater than about 5 nm. In one or more embodiments, the first dielectric layer 220 may have a thickness greater than about 10 nm. In one or more embodiments, the first dielectric layer 220 may have a thickness greater than about 15 nm. In one or more embodiments, the first dielectric layer may be about 8 nm.

Figure 2:
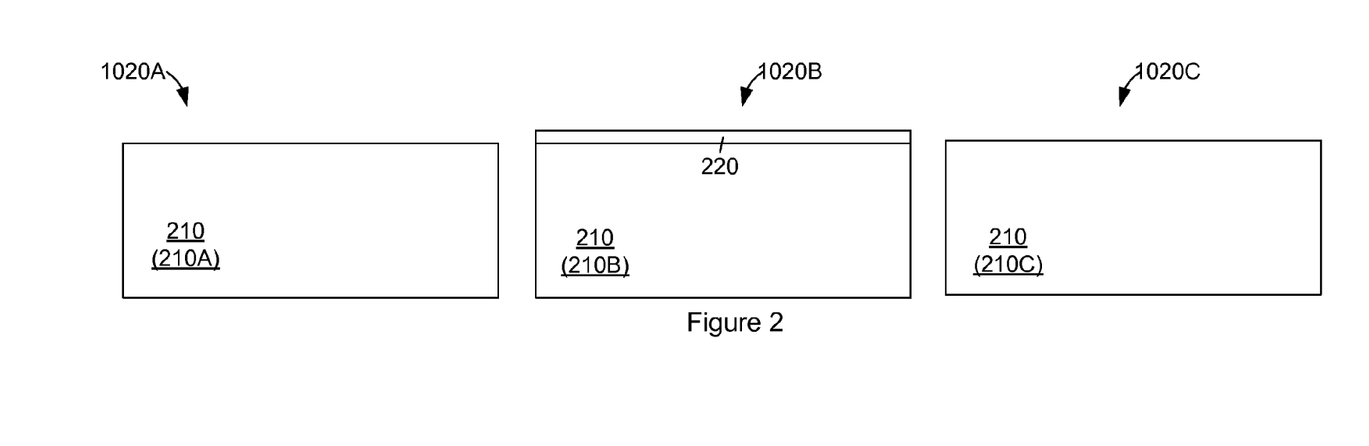

Referring to FIG. 2, the dielectric layer 220 is then etched so that it is removed from the portion 210A and portion 210C of substrate 210. As seen, the dielectric layer 220 is not substantially removed from the portion 210B of substrate 210. The etching process forms the structures 1020A, 1020B and 1020C.

Figure 3:
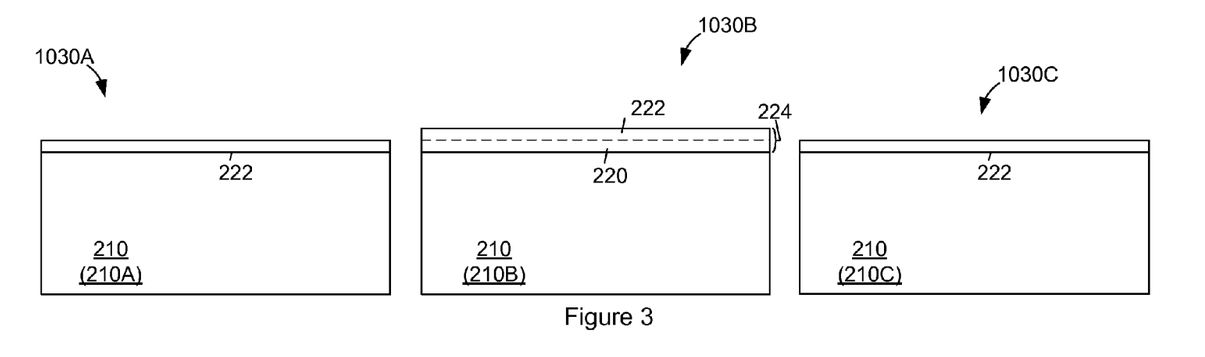

Referring to FIG. 3, an additional dielectric material 222 is formed over the first substrate portion 210A, second substrate portion 210B and third substrate portion 210C. In one or more embodiments, the additional dielectric material 222 may be the same material as dielectric layer 220 shown in FIG. 1. The additional dielectric material 222 may, for example, be an oxide (such as silicon dioxide) which is formed by a growth process. In one or more embodiments, the additional dielectric material 222 may comprise another type of dielectric material such as a nitride or an oxynitride.

The additional dielectric material 222 results in structures 1030A,B,C shown in FIG. 3. The combination of dielectric layer 220 and dielectric layer 222 forms a first dielectric layer 224. The dielectric layer 222 is referred to as first dielectric layer 222. In one or more embodiments, the first dielectric layer 222 and the first dielectric layer 224 may be formed of the same material. This same material may be an oxide such as silicon dioxide. The oxide may be formed by a thermal or growth process.

Figure 4:
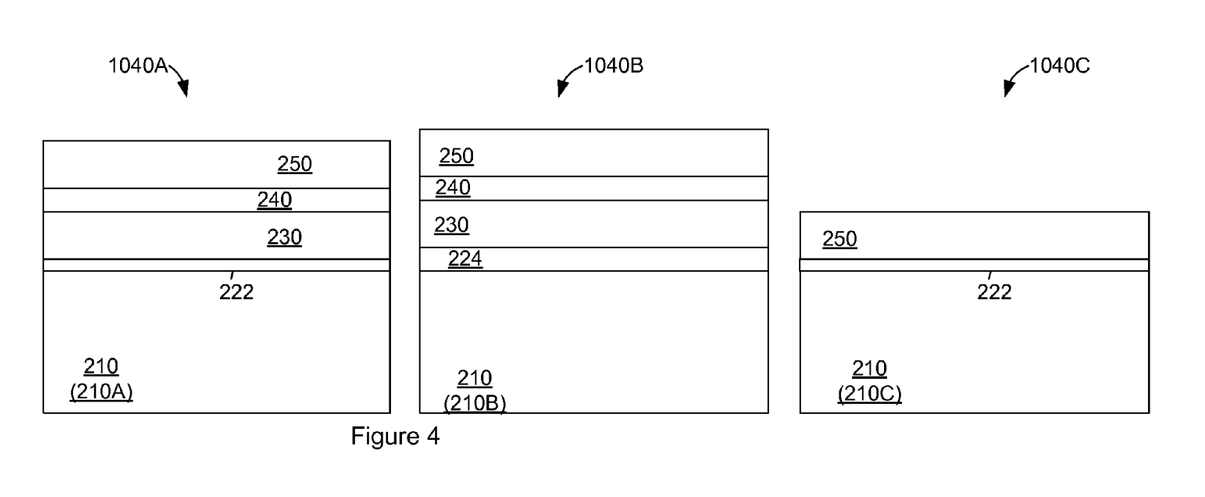

FIG. 4 shows structures 1040A,B,C. A first gate layer 230 is formed over the first dielectric layer 222 of structure 1030A and over the first dielectric layer 224 of structure 1030B but not over structure 1030C. In one or more embodiments, the first gate layer 230 may include a conductive material. In one or more embodiments, the first gate layer 230 may include a polysilicon material. The polysilicon material may be a doped polysilicon material (either n-doped or p-doped). The polysilicon material may be doped in-situ.

In one or more embodiments, the first gate layer 230 may include a conductive material. The first gate layer 230 may include a metallic material such as a pure metal or a metal alloy. The first gate layer 230 may be formed as a composite of two or more materials. The first gate layer 230 may be a stack of two or more sub-layers. As an example, the first gate layer 230 may include a metal layer disposed over the top of a polysilicon layer. In one or more embodiments, the first gate layer 230 may include a silicide layer disposed over the top of a polysilicon layer. Examples of a silicide layer include cobalt silicide and tungsten silicide. In one or more embodiments, the first gate layer 230 may have a thickness greater than about 100 nm. In one or more embodiments, the gate layer 230 may have a thickness greater than about 150 nm. In one or more embodiments, the gate layer 230 may have a thickness greater than about 200 nm.

Still referring to FIG. 4, a second dielectric layer 240 is formed over the first gate layer 230 over portions 210A and 210B of substrate 210 but not over the portion 210C. In one or more embodiments, the second dielectric layer 240 may include an oxide. An example of an oxide is silicon dioxide ($SiO_2$). In one or more embodiments, the second dielectric layer 240 may be an oxide (such as silicon dioxide) that is formed by a growth process. Another example of an oxide is tantalum oxide. In one or more embodiments, the second dielectric layer 240 may include a nitride. An example of a nitride is silicon nitride. In one or more embodiments, the second dielectric layer 240 may include a nitrided oxide. In one or more embodiments, the second dielectric material may include an oxynitride. An example of an oxynitride is SiON. Another example of an oxynitride is $SiO_xN_y$. In one or more embodiments, the second dielectric layer 240 may include a high-k dielectric material. As one example, the high-k dielectric may have a dielectric constant greater than that of silicon dioxide. In another example, the high-k dielectric may have a dielectric constant greater than about 3.9.

In one or more embodiments, the second dielectric layer 240 may comprise two or more materials. For example, the second dielectric layer may be a mixture of two or more material. In one or more embodiments, the mixture may be a homogeneous mixture. In one or more embodiments, the mixture may be a heterogeneous mixture. In one or more embodiments, the second dielectric layer 240 may be a stack of two or more layers such as an oxide/nitride stack, a nitride/oxide stack or an oxide/nitride/oxide stack. In an embodiment, the second dielectric layer 240 may be formed of a composite of two or more materials.

In one or more embodiments, the second dielectric layer 240 may have a thickness greater than about 10 nm. In one or more embodiments, the second dielectric layer 240 may have a thickness greater than about 15 nm. In one or more embodiments, the second dielectric layer 240 may have a thickness greater than about 20 nm. In one or more embodiments, the second dielectric layer may be about 16 nm.

Still referring to FIG. 4, a second gate layer 250 is formed over the second dielectric layer 240 of structures 1040A and 1040B. The second gate layer 250 is also formed over the first dielectric layer 222 of structure 1040C. In one or more embodiments, the second gate layer 250 may include a conductive material. The second gate layer 250 may include a polysilicon material. The polysilicon material may be a doped polysilicon material (either n-doped or p-doped). The polysilicon material may be doped in-situ. The polysilicon material may be doped by an ion implantation process. For example, the polysilicon material may be doped by a later process (such as one used to later form the extension regions or the source/drain regions).

In one or more embodiments, the second gate layer 250 may include a conductive material. In an embodiment, the second gate layer 250 may include a metallic material such as a pure metal or a metal alloy. The second gate layer 250 may be formed as a composite of two or more materials. The second gate layer 250 may be a stack of two or more sub-layers. As an example, the second gate layer 250 may include a metal layer disposed over the top of a polysilicon layer. In one or more embodiments, the second gate layer 250 may include a silicide layer disposed over the top of a polysilicon layer. Examples of a silicide layer include cobalt silicide and tungsten silicide. In one or more embodiments, the second gate layer 250 may have a thickness greater than about 100 nm. In one or more embodiments, the gate electrode layer 250 may have a thickness greater than about 150 nm. In one or more embodiments, the gate electrode layer 250 may have a thickness greater than about 200 nm.

The first dielectric layers 222 and 224, first gate layer 230, second dielectric layer 240 and second gate layer 250 may then be masked and etched over portions 210A, 210B and 210C of the substrate 210. The result of the masking and etching is to form a first gate stack 300A over the first substrate portion 210A, a second gate stack 300B over the second substrate portion 210B and a third gate stack 300C over the third substrate portion 210C. This results in the structures 1050A, 1050B and 1050C as shown in FIG. 5.

Figure 5:
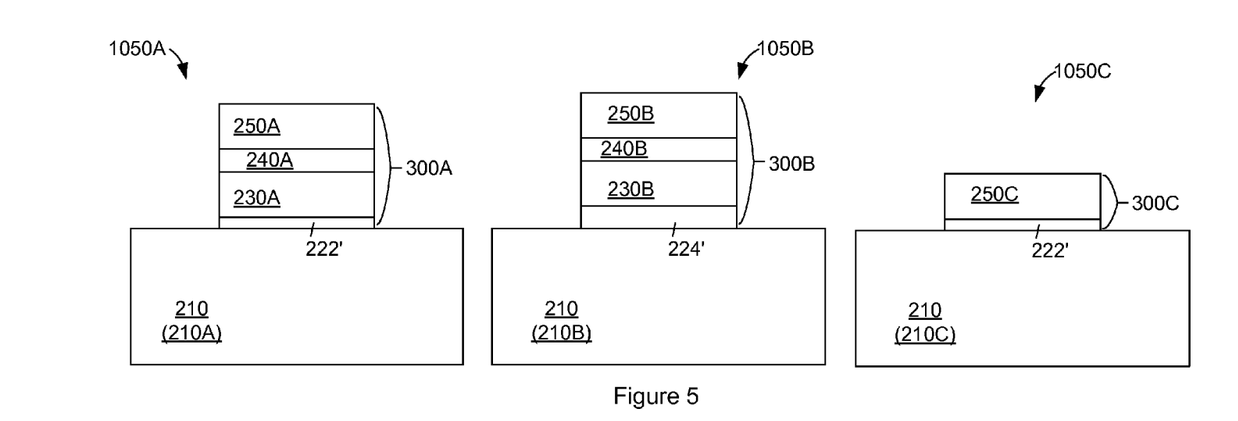

The gate stack 300A shown in FIG. 5 includes a first dielectric layer 222' (which is a portion of first dielectric layer 222 shown in FIG. 4), a first gate layer 230A (which is a portion of first gate layer 230 in FIG. 4), a second dielectric layer 240A (which is a portion of second dielectric layer 240 in FIG. 4) and a second gate layer 250A (which is a portion of second gate layer 250 in FIG. 4). The first gate layer 230A may form a charge storage layer for the gate stack 300A. In one or more embodiments, the charge storage layer may be a floating gate layer (also referred to as a floating gate). In one or more embodiments, the charge storage layer may be a charge trapping layer. The second gate layer 250A may form a control gate layer (also referred to as a control gate) for the gate stack 300A.

In one or more embodiments, the gate stack 300A may include one or more additional layers. For example, it is possible that the gate stack 300A includes an additional pre-gate layer between the first dielectric layer 222' and the substrate portion 210A. Likewise, it is also possible that the gate stack 300A may include a buffer layer between the first dielectric layer 222 and the first gate layer 230A.

The gate stack 300B shown in FIG. 5 includes a first dielectric layer 224' (which is a portion of first dielectric layer 224 shown in FIG. 4), a first gate layer 230B (which is a portion of first gate layer 230 in FIG. 4), a second dielectric layer 240B (which is a portion of second dielectric layer 240 in FIG. 4) and a second gate layer 250B (which is a portion of second gate layer 250 in FIG. 4).

In one or more embodiments, the gate stack 300B may include one or more additional layers. For example, it is possible that the gate stack 300B includes an additional pre-gate layer between the first dielectric layer 222 and the substrate portion 210B. Likewise, it is also possible that the gate stack 300B may include a buffer layer between the first dielectric layer 224' and the first gate layer 230B.

The gate stack 300C shown in FIG. 5 includes a first dielectric layer 222' (which is a portion of first dielectric layer 222 shown in FIG. 4) and a second gate layer 250C (which is a portion of first gate layer 250 in FIG. 4). The first dielectric layer 222' may be gate dielectric for the gate stack 300C. The second gate layer 250C may be a gate electrode layer (also referred to as a gate electrode) for the gate stack 300C.

In one or more embodiments, the gate stack 300C may include one or more additional layers. For example, it is possible that the gate stack 300C includes an additional pre-gate layer between the first dielectric layer 222' and the substrate portion 210C. Likewise, it is also possible that the gate stack 300C may include a buffer layer between the first dielectric layer 222' and the second gate layer 250C.

Figure 6:
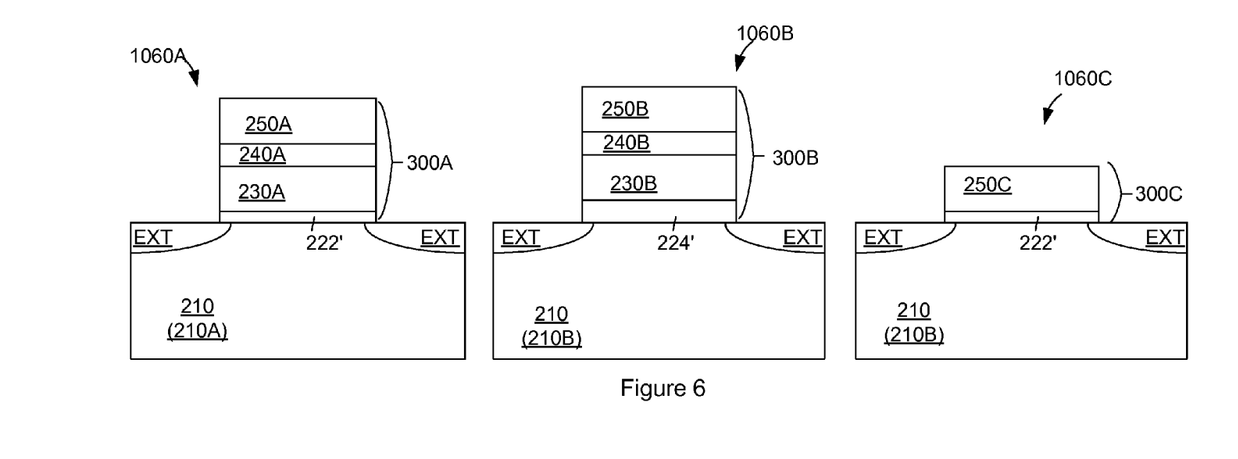

After the formation of the gate stacks 300A, 300B and 300C, the structures 1050A, 1050B and 1050C from FIG. 5 may be appropriately doped using an ion implantation process to form source/drain extension regions EXT as shown in structures 1060A, 1060B and 1060C. In one or more embodiments, the source/drain extension regions EXT may, for example, be lightly doped drain (LDD) regions. In one or more embodiments, the extension regions EXT may, for example, be medium doped drain (MDD) regions.

In one or more embodiments, the extension regions EXT may be n-type. In one or more embodiments, the extension regions EXT may be p-type. In one or more embodiments, during the formation of the extension regions EXT, the second gate layers 250A, 250B and 250C may also be doped with n-type and/or p-type dopants. The source/drain extension implant forms the structures 1060A, 1060B and 1060C of FIG. 6 that include doped extensions regions EXT. In one or more embodiments, the doping of the three structures may take place at the same time. In one or more embodiments, it may take place at different times.

In one or more embodiments, the extension regions EXT of the structure 1060A may be more heavily doped than the extension regions EXT of the structures 1060B,C. In one or more embodiments, the extension regions EXT of the structure 1060A may be more lightly doped than the extension regions EXT of the structures 1060B and 1060C. In one or more embodiments, the dopant concentration of the extension regions EXT of the structure 1060A may be about the same as the dopant concentration of the extension regions EXT of the structures 1060B and 1060C.

In one or more embodiments, the extension regions EXT for the structures 1060A,B,C may be doped with an n-type material. Examples of n-type materials include phosphorous and arsenic. In one or more embodiments, the extension regions EXT for the structures 1060A,B,C may be doped with a p-type material. An example of a p-type material is boron.

Figure 7:
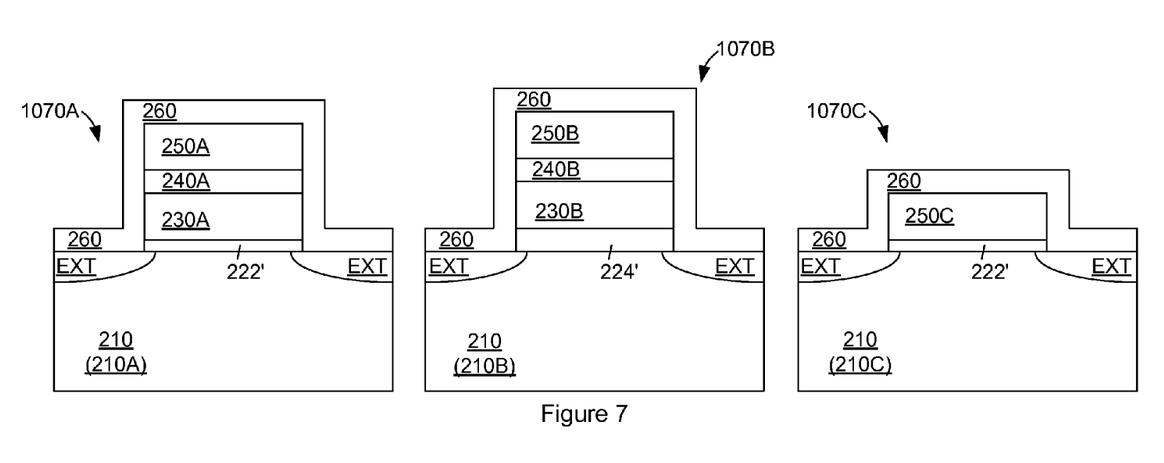

Referring now to FIG. 7, after the formation of the extension regions EXT, a layer 260 is formed over the structures 1060A,B,C of FIG. 6 to form the structures 1070A,B,C shown in FIG. 7. In one or more embodiments, the layer 260 may be formed by a growth process. In one or more embodiments, the layer 260 may be formed by a deposition process. In one or more embodiments, the layer 260 may be conformally or substantially conformally deposited over the structures 1060A,B,C.

In one or more embodiments, the layer 260 may comprise a dielectric material. In one or more embodiments, the layer 260 may be a dielectric layer. In one or more embodiments, the dielectric layer may be formed by a growth process. In one or more embodiments, the dielectric layer may be formed by a deposition process.

In one or more embodiments, the layer 260 may include an oxide. An example of an oxide is silicon dioxide ($SiO_2$). Another example of an oxide is tantalum oxide. In one or more embodiments, the layer 260 may include a nitride. An example of a nitride is silicon nitride. In one or more embodiments, the dielectric material may include an oxynitride. An example of an oxynitride is SiON. Another example of an oxynitride is $SiO_xN_y$. In one or more embodiments, the layer 260 may include a high-k dielectric material. As one example, the high-k dielectric may have a dielectric constant greater than that of silicon dioxide. In another example, the high-k dielectric may have a dielectric constant greater than about 3.9.

In an embodiment, the layer 260 may comprise two or more materials. For example, the layer 260 may be a mixture of two or more materials. In one or more embodiments, the mixture may be a homogeneous mixture. In one or more embodiments, the mixture may be a heterogeneous mixture. The layer 260 may be formed as a composite of two or more materials. In one or more embodiments, the layer 260 may be formed as a stack of two or more layers. In one or more embodiments, the layer 260 may have a thickness greater than about 10 nm. In one or more embodiments, the layer 260 may have a thickness greater than about 15 nm. In one or more embodiments, the layer 260 may have a thickness greater than about 20 nm. In one or more embodiments, the layer may be about 16 nm. In one or more embodiments, the layer 260 may be conformally or substantially conformally deposited over the structures 1060A,B,C shown in FIG. 6.

Figure 8:
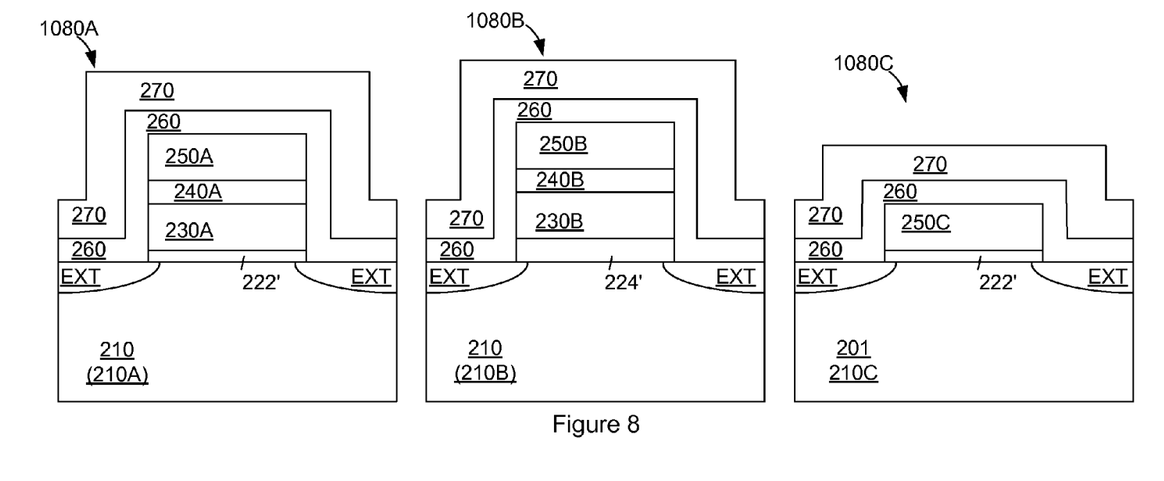

Referring to FIG. 8, a layer 270 is formed over the structures 1070A,B,C shown in FIG. 7 to form the structures 1080A,B,C shown in FIG. 8. In one or more embodiments, the layer 270 may be conformally or substantially conformally deposited over the structures 1070A,B,C shown in FIG. 7. In one or more embodiments, the layer 270 may be conformally or substantially conformally deposited over the layer 260.

In one or more embodiments, the layer 270 may comprise a polysilicon material. In one or more embodiments, the layer 270 may be a polysilicon layer. The layer 270 may comprise a doped polysilicon material. In one or more embodiments, the doped polysilicon material may be in-situ doped. In one or more embodiments, the polysilicon material may be dope using an ion implantation process. In one or more embodiments, the polysilicon material may be doped using a downstream doping process such as the one used to form the source/drain regions. In one embodiment, the polysilicon layer may be n-doped. In another embodiment, the polysilicon layer may be p-doped.

In one or more embodiments, the layer 270 may comprise a conductive material.

Figure 9:
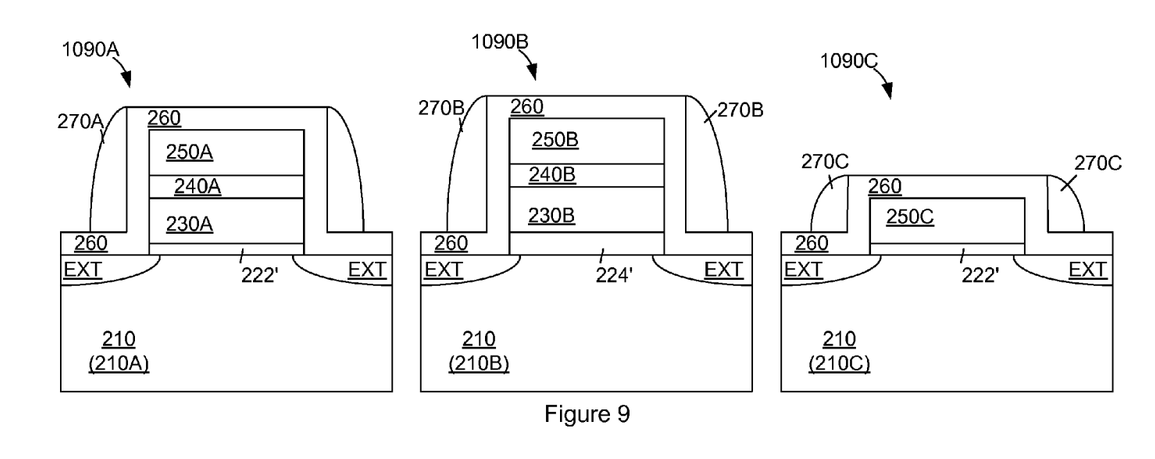

Referring to FIG. 9, the layer 270 may then be etched to form sidewall spacers 270A,B,C over the sidewalls of layer 260 as shown in structures 1090A,B,C. The etch may be an anisotropic etch or a substantially anisotropic etch. In one or more embodiments, the etch may include a dry or plasma etch process. In one or more embodiments, the sidewalls spacers 270A,B,C may comprise a polysilicon material. In one or more embodiments, the sidewall spacers 270A,B,C may comprise doped polysilicon. In one or more embodiments, the polysilicon material may be n-doped. In one or more embodiments, the polysilicon material may be p-doped. In one or more embodiments, the sidewall spacers 270A, 270B and/or 270C may be polysilicon sidewall spacers. In one or more embodiments, the polysilicon sidewall spacers 270A, 270B and/or 270C may be doped polysilicon. The doped polysilicon may be n-type doped or p-type doped. As shown in FIG. 9, the sidewall spacers 270A,B,C may be disposed over the substrate portions 210A,B,C respectively and may be laterally disposed from the gate stacks 300A,B,C respectively.

Figure 10:
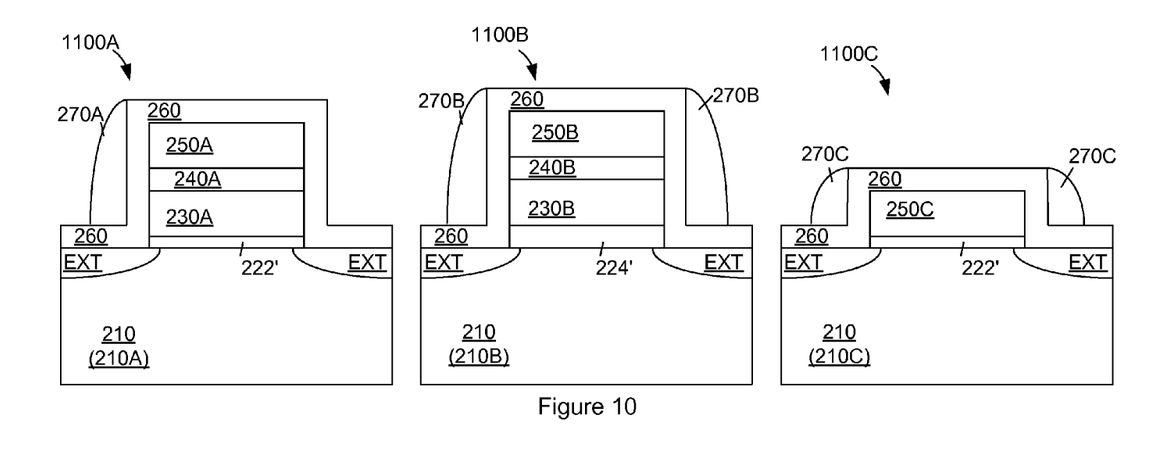

Referring now to FIG. 10, one of the sidewall spacers 270A may be removed (for example, by an etch process) from the structure 1090A of FIG. 9 to form the structure 1100A shown in FIG. 10. In one or more embodiments, the spacers 270A may comprise a polysilicon material while the layer 260 may comprise a dielectric (such as an oxide). Hence, in one or more embodiments, an appropriate etch may be chosen which is selective to the polysilicon.

Figure 11:
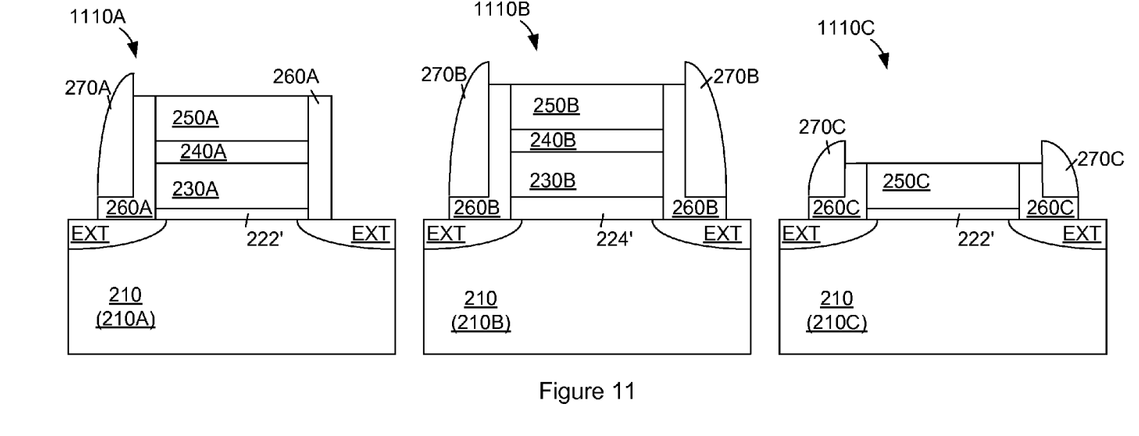

The layer 260 from FIG. 10 may be subjected to an etch so as to remove portions of the layer 260 that are disposed over the top surface of the gate stacks 300A,B,C as well as exposed portions of the layer 260 that exposed on the substrate 210. The etch may be an anisotropic etch or a substantially anisotropic etch. In one or more embodiments, the etch may include a dry etch or a plasma etch process. After the etch, the structures 1110A,B,C are formed as shown in FIG. 11. The portions 260A, 260B and 260C of layer 260 remain in the structures 1110A, 1110B and 1110C respectively. The etch may be an anisotropic etch. The etch exposes the top surfaces of second gate layers 250A, 250B and 250C. The etch also exposes portions of the substrate portions 210A, 210B and 210C.

Figure 12:
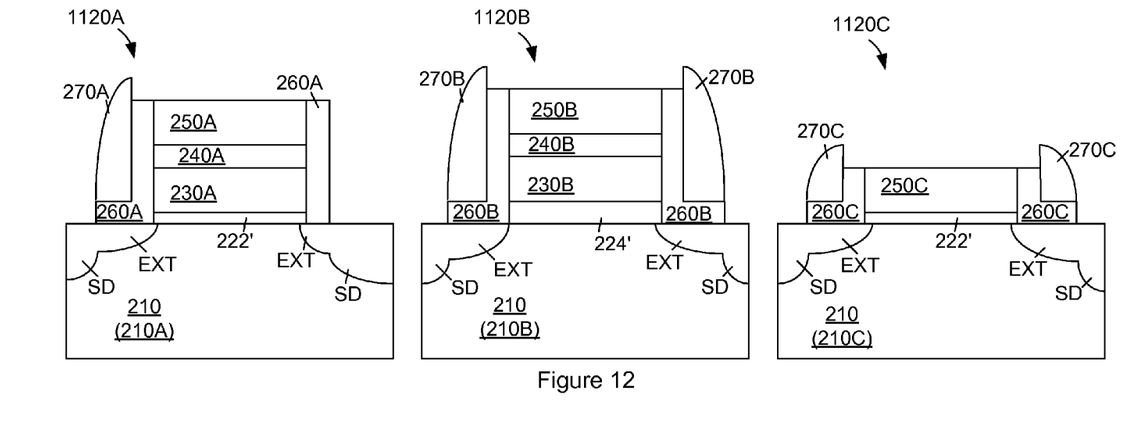

The structures 1110A,B,C from FIG. 11 are each exposed to a doping process to form the structures 1120A,B,C shown in FIG. 12. The doping process may be performed by one or more ion implantation processes. The doping process forms source/drain regions SD in the substrate portions 210A,B,C. In one or more embodiments, the source/drain regions SD may be formed as heavily doped drain (HDD) regions.

In one or more embodiments, the dopant concentrations of the source/drain regions SD of each of the structures 1120A, B,C may be greater than the dopant concentration of the extension regions EXT of the corresponding structure. Also, in one or more embodiments, the depth of the source/drain regions SD of structures 1120A,B,C may be greater than the depth of the extension regions of the corresponding structure.

In one or more embodiments, the dopant dose of the ion implantation process to form the source/drain regions SD of each of the structures 1120A,B,C may be greater than the dopant dose to form the extension regions EXT of the corresponding structure. Also, in one or more embodiments, the dopant energy of the ion implantation process to form the source/drain regions SD of structures 1120A,B,C may be greater than the dopant energy to form the extension regions of the corresponding structure.

In one or more embodiments, the source/drain regions SD of the structures 1120A,B,C may be formed at substantially the same time. In one or more embodiments, the source/drain regions SD of the structures 1120A,B,C may be formed at different times.

In one or more embodiments, the same doping process used to form the source/drain regions SD of the structures 1120A,B,C may also be used to dope the second gate layers 250A,B,C of the structures. In one or more embodiments, the second gate layers 250A,B,C may comprise a polysilicon material. In one or more embodiments, this polysilicon material may be deposited undoped in the structures 1040A,B,C shown in FIG. 4. The polysilicon material may then be doped by the same doping process (such as an ion implantation process) used to form the source/drain SD regions.

Figure 13:
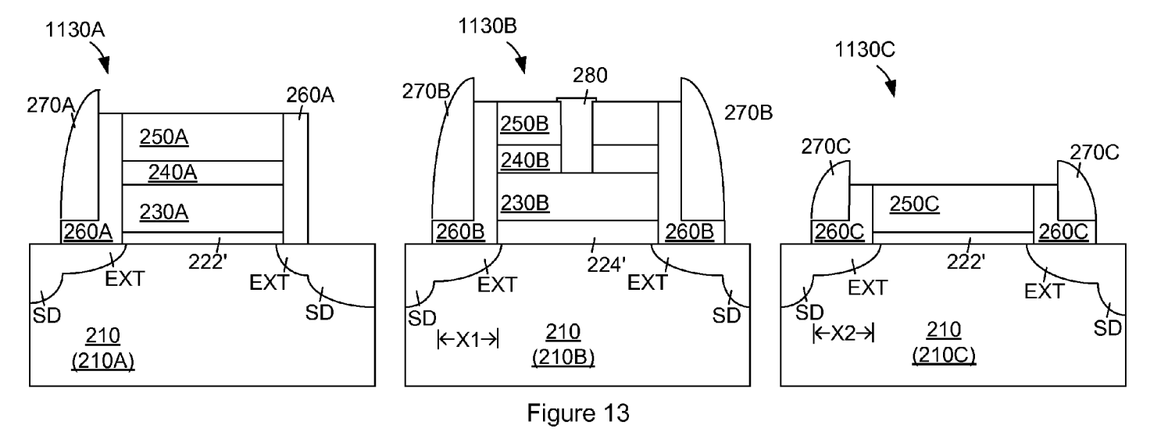

FIG. 13 shows structures 1130A,B,C. Referring to FIG. 13, an opening may be formed through the second gate layer 250B and through the second dielectric layer 240B of structure 1130B so as to expose the first gate layer 230B. The opening may be filled with a conductive plug 280. The conductive plug 280 electrically couples the first gate layer 230B to the second gate layer 250B.

Figure 14:
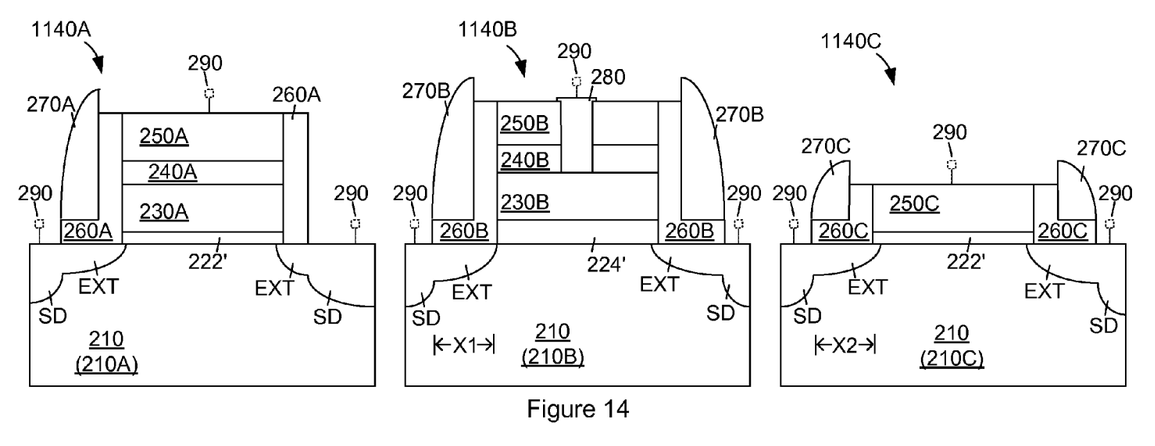

FIG. 14 shows the addition of contacts 290 to form the structures 1140A,B,C. In one of more embodiments, the structure 1140A is memory device. The memory device may be a charge storage memory device. In one or more embodiments, the charge storage device may be a floating gate memory device. The memory device 1140A includes a gate stack 300A. The gate stack 300A includes a first dielectric layer 222', a first gate layer 230A, a second dielectric layer 240A and a second gate layer 250A. The first dielectric layer 222' may, for example, comprise an oxide (such as a silicon dioxide). The first gate layer 230A may serve a floating gate layer which may also be referred to as a floating gate. The first gate layer 230A (and, hence, the floating gate) may comprise a doped polysilicon. The second dielectric layer 240A may serve as an inter-gate dielectric and may, for example, comprise an oxide (such as silicon dioxide). The second gate layer 250A may be a control gate layer which may also be referred to as a control gate. The second gate layer 250A may be formed of a doped polysilicon. The memory device 1140A also includes a sidewall spacer 270A. The sidewall spacer 270A may serve as a select gate for the memory device 1140A. The sidewall spacer 270A may also comprise a doped polysilicon.

It is noted that one or more embodiments, the control gate 250A may be coupled to a first voltage while the select gate 270A may be coupled to a second voltage. The first and second voltage may be the same or different voltages. The first or second voltages may be a ground potential. In another embodiment of the invention, it is possible that the control gate 250A be coupled to voltage while the select gate 270A be permitted to float.

In another embodiment, it is possible that the memory structure 1130A be formed as a charge trapping device. In this case, the charge storage layer 230A may be a charge trapping layer. An example of a charge trapping layer is a nitride layer (such as silicon nitride). Another example of a charge trapping layer is a nanocrystalline layer.

Still referring to FIG. 14, in one or more embodiments, the structure 1140B may form a transistor device. The transistor device 1140B includes a gate stack 300B. The gate stack 300B includes a first dielectric layer 224'. The first dielectric layer 224' may be a gate dielectric for the gate stack 300B. The gate stack 300B also includes a first gate layer 230B, a second dielectric layer 240B and a second gate layer 250B. The first gate layer 230B and the second gate layer 250B are electrically coupled together to form a gate electrode for the transistor device 1140B.

In an embodiment, the first dielectric layer 224' may be an oxide layer (such as silicon dioxide). In an embodiment, first gate layer 230B may comprise a doped polysilicon material. In an embodiment, the second dielectric layer 240B may comprise an oxide material such as a silicon dioxide material.

The transistor device 1140B may be a field-effect transistor device. The field-effect transistor device may, for example, be a MOS field-effect transistor device. The MOS transistor may be an NMOS transistor having an n-channel or a PMOS transistor having a p-channel. It is possible that the substrate region 210B include at least one NMOS transistor and at least one PMOS transistor to form a CMOS device. The transistor device 1140B may be a high-voltage transistor device.

Referring to the structure 1140B includes source/drain regions SD and extension regions EXT. It is seen that the distance from the source/drain regions SD to the beginning of the gate stack 300B is a distance "X1". The distance X1 may be changed by changing the thickness of the sidewall spacers 270B. The thickness of the sidewall spacers 270B (and, hence, the distance X1) may be increased by increasing the height of the gate stack 300B.

Still referring to FIG. 14, in one or more embodiments, the structure 1140C may form a transistor device. The transistor device 1140C includes a gate stack 300C. The gate stack 300C includes a first dielectric layer 222'. The first dielectric layer 222' may be a gate dielectric for the gate stack 300C. The gate stack 300C also includes a second gate layer 250B. The second gate layer 250C forms a gate electrode for the transistor device 1140C.

In an embodiment, the first dielectric layer 222' may be an oxide layer (such as silicon dioxide). In an embodiment, first gate layer may comprise a doped polysilicon material.

The transistor device 1140C may be a field-effect transistor device. In one or more embodiments, the transistor device 1140C may be a low-voltage transistor device. The field-effect transistor may be a MOS transistor device. The MOS transistor may be an NMOS transistor having an n-channel or a PMOS transistor having a p-channel. It is possible that the substrate region 210C include at least one NMOS transistor and at least one PMOS transistor to form a CMOS device.

Referring to FIG. 14, the structure 1140C includes source/drain regions SD and extension regions EXT. It is seen that the distance from the source/drain regions SD to the beginning of the gate stack 300C is a distance "X2". The distance X2 may be changed by changing the thickness of the sidewall spacers 270C. The distance X2 may be changed by changing the thickness of the sidewall spacers 270C. The thickness of the sidewall spacers 270C (and, hence, the distance X2) may be increased by increasing the height of the gate stack 300C. In one or more embodiments, the thickness of sidewall spacers 270B may be greater than the thickness of sidewall spacers 270C. In one or more embodiments, the distance X1 may be greater than the distance X2.

It is observed that, in one or more embodiments, the spacers 270B and 270C may be formed during the same processing steps used (and at substantially the same time as) the formation of spacers 270A.

Figure 15:
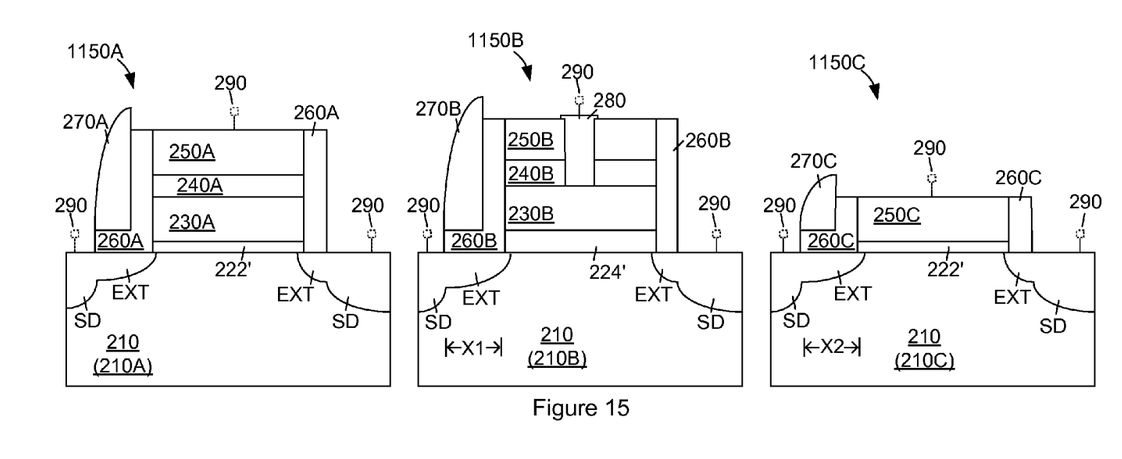
FIG. 15 provides an embodiment of a memory device, an embodiment of a first transistor and an embodiment of a second transistor in accordance with the present invention.

Another embodiment of the invention is shown in FIG. 15. FIG. 15 shows a transistor structure 1150B that only includes a single sidewall spacer 270B. The sidewall spacer 270B may be formed of a polysilicon material such as a doped polysilicon material. In an embodiment, the spacer 270B may be n-doped. In an embodiment, the spacer 270B may be p-doped. FIG. 15 also shows a transistor structure 1150C that only includes a single sidewall spacer 270C. The sidewall spacer 270C may be formed of a polysilicon material such as a doped polysilicon material. In an embodiment, the spacer 270C may be n-doped. In an embodiment, the spacer 270C may be p-doped.

Figure 16:
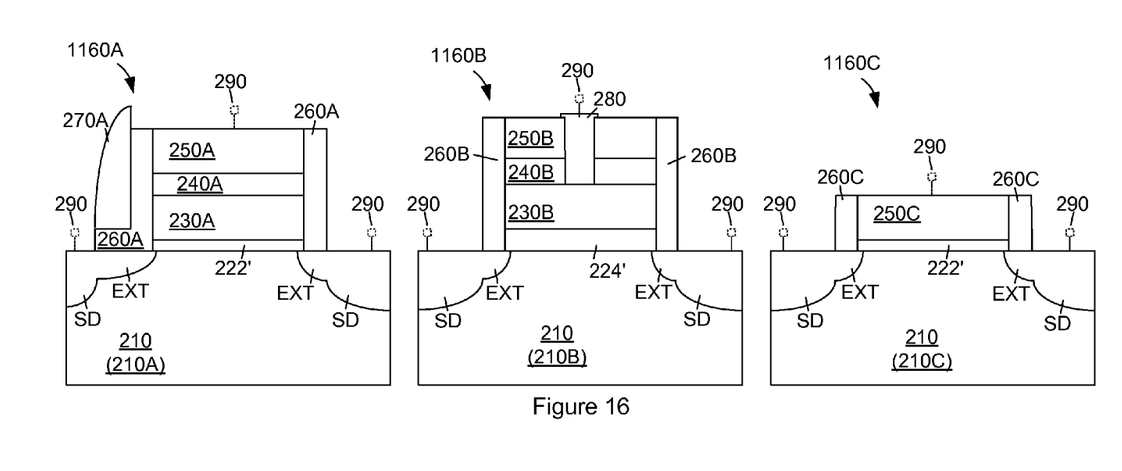
FIG. 16 provides an embodiment of a memory device, an embodiment of a first transistor and an embodiment of a second transistor in accordance with the present invention.

Another embodiment of the invention is shown in FIG. 16. FIG. 16 shows a transistor structure 1160B that does not include a sidewall spacer 270B. In one or more embodiments, the structure 1160B shown in FIG. 16 may be formed by forming the structure 1140B in FIG. 14 and then removing the spacers 270B to form the structure 1160B shown in FIG. 16.

FIG. 16 also shows a transistor structure 1160C that does not include a sidewall spacer 270C. In one or more embodiments, the structure 1160C shown in FIG. 16 may be formed by forming the structure 1140C in FIG. 14 and then removing the spacers 270C to form the structure 1160C shown in FIG. 16.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

What is claimed is:

1. A field effect transistor, comprising:
   a substrate;
   a gate stack disposed over said substrate, said gate stack comprising a gate electrode overlying a gate dielectric; and
   a sidewall spacer disposed over said substrate and laterally disposed from said gate stack, said spacer comprising a polysilicon material,
   wherein said gate electrode comprises
      a first gate layer,
      a dielectric layer disposed over said first gate layer, and
      a second gate layer disposed over said dielectric layer, said second gate layer electrically coupled to said first gate layer.

2. The transistor of claim 1, further comprising a dielectric layer disposed between said spacer and said gate stack.

3. The transistor of claim 1, wherein said polysilicon material is n-type doped or p-type doped.

4. The transistor of claim 1, wherein said transistor is a MOS transistor.

5. The transistor of claim 1, further comprising a dielectric layer between said spacer and said gate stack.

6. The device of claim 1, wherein said first gate layer comprises a first conductive layer and said second gate layer comprises a second conductive layer.

7. An integrated circuit, comprising:
   a substrate;
   a memory device including:
      a first gate stack disposed over said substrate, said first gate stack comprising a control gate disposed over a charge storage layer, and
      a polysilicon spacer select gate overlying said substrate, said spacer select gate laterally disposed from said first gate stack; and
   a field effect transistor including:
      a second gate stack disposed over said substrate, said second gate stack comprising a gate electrode overlying a gate dielectric, and
      a polysilicon spacer disposed over said substrate and laterally disposed from said second gate stack.

8. The integrated circuit of claim 7, wherein said control gate comprises a polysilicon material.

9. The integrated circuit of claim 7, wherein said charge storage layer is a floating gate.

10. The integrated circuit of claim 7, wherein said charge storage layer is a charge trapping layer.

11. The integrated circuit of claim 7, wherein said floating gate comprises a polysilicon material.

12. The integrated circuit of claim 7, wherein said gate electrode comprises a polysilicon material.

13. The integrated circuit of claim 7, wherein said first gate stack further comprises
   a first dielectric layer between said charge storage layer and said substrate, and
   a second dielectric layer between said control gate and said charge storage layer.

14. The integrated circuit of claim 7, wherein said gate electrode comprises
   a first gate layer,
   a dielectric layer disposed over said first gate layer, and
   a second gate layer disposed over said dielectric layer, said second gate layer electrically coupled to said first gate layer.

15. The integrated circuit of claim 7, wherein said memory device is in electrical communication with said field effect transistor.

* * * * *